United States Patent
Rozen et al.

(10) Patent No.: US 8,558,626 B2
(45) Date of Patent: Oct. 15, 2013

(54) METHOD AND APPARATUS FOR GENERATING A CLOCK SIGNAL

(75) Inventors: Anton Rozen, Gedera (IL); Michael Priel, Hertzelia (IL); Amir Zaltzman, Moshav Amikam (IL)

(73) Assignee: Freescale Semiconductor, Inc., Austin, TX (US)

( * ) Notice: Subject to any disclaimer, the term of this patent is extended or adjusted under 35 U.S.C. 154(b) by 48 days.

(21) Appl. No.: 13/126,038

(22) PCT Filed: Nov. 24, 2008

(86) PCT No.: PCT/IB2008/054923
§ 371 (c)(1),
(2), (4) Date: Apr. 26, 2011

(87) PCT Pub. No.: WO2010/058249
PCT Pub. Date: May 27, 2010

(65) Prior Publication Data
US 2011/0199159 A1 Aug. 18, 2011

(51) Int. Cl.
*H03K 3/03* (2006.01)

(52) U.S. Cl.
USPC .............................. 331/57; 331/74

(58) Field of Classification Search
USPC ........................................ 331/57, 74
See application file for complete search history.

(56) References Cited

U.S. PATENT DOCUMENTS

| | | | |
|---|---|---|---|
| 6,134,191 A | 10/2000 | Alfke | |
| 6,204,694 B1 * | 3/2001 | Sunter et al. | 326/93 |
| 6,233,205 B1 * | 5/2001 | Wells et al. | 368/118 |
| 6,992,516 B2 * | 1/2006 | Yeh | 327/175 |
| 7,746,131 B2 * | 6/2010 | Chan et al. | 327/143 |
| 2001/0019291 A1 | 9/2001 | Nakano | |
| 2003/0037307 A1 | 2/2003 | Berthold et al. | |
| 2004/0130357 A1 | 7/2004 | Smith | |
| 2007/0152739 A1 | 7/2007 | Banerjee et al. | |
| 2008/0120065 A1 | 5/2008 | Joshi et al. | |
| 2008/0122513 A1 * | 5/2008 | Ong et al. | 327/263 |
| 2008/0256503 A1 | 10/2008 | Goodnow et al. | |

FOREIGN PATENT DOCUMENTS

WO 2005/088424 A 9/2005

OTHER PUBLICATIONS

Ernst D et al: "Razor: A Low-Power Pipeline Based on Circuit-Level Timing Speculation" Microarchitecture, 2003, Micro-36 Proceedings, 36th Annual IEEE/ACM International Symposium on Dec. 3-5, 2003, Piscataway, NJ, USA, IEEE, Dec. 3, 2003, pp. 7-18.
International Search Report and Written Opinion correlating to PCT/IB2008/054923 dated Jul. 29, 2009.

* cited by examiner

*Primary Examiner* — Arnold Kinkead
*Assistant Examiner* — Richard Tan

(57) ABSTRACT

An integrated circuit comprising oscillator circuitry is arranged to generate a clock signal for functional logic module of the integrated circuit. The oscillator circuitry comprises a plurality of propagation paths, and is arranged to apply a transition signal to inputs of the plurality of propagation paths, and to cause the output clock signal to transition based on a propagation of the transition signal through a determined set of the propagation paths.

20 Claims, 6 Drawing Sheets

METHOD AND APPARATUS FOR GENERATING A CLOCK SIGNAL

FIELD OF THE INVENTION

The field of this invention relates to a method and apparatus for generating a clock signal, and in particular to an integrated circuit comprising oscillator circuitry arranged to generate a clock signal for a functional logic module of the integrated circuit, and a method therefor.

BACKGROUND OF THE INVENTION

In the field of integrated circuits (ICs) and semiconductor devices, it is known for manufacturing and fabrication processes to have variable effects on the performance and characteristics of individual integrated circuits. For example, the performance and characteristics of individual integrated circuits typically varies depending on the location of each electrical element within the integrated circuit.

In order for cells within an integrated circuit to function correctly at a specific operating frequency, a minimum supply voltage is required in order to drive the cells within the integrated circuit such that logical transitions performed by those cells occur fast enough to achieve the required operating frequency. Performance of the logical cells, which is typically composed from transistors, and which usually perform simple logic operations such as OR, AND, XOR, INV and the like, depends on production process parameters, supply voltage and temperature. Due to the performance variations within individual integrated circuits, the minimum supply voltage that is needed to achieve a required operating frequency typically varies between individual integrated circuits.

A system comprising an integrated circuit may be arranged to provide a predetermined supply voltage to the integrated circuit, and to provide an operating clock signal to the integrated circuit comprising an operating frequency at which the semiconductor device is required to operate based on the system design. The supply voltage may be set dependent upon whether the system is required to be optimised to achieve a particular performance (e.g. a higher supply voltage) or for power consumption (e.g. a lower supply voltage), where the operating frequency may be determined based on the supply voltage, in order to achieve optimum performance for that supply voltage. Alternatively, the operating frequency may be set dependent upon whether the system is required to be optimised to achieve a particular performance (e.g. a higher operating frequency) or for power consumption (e.g. to a lower operating frequency), where the supply voltage may be determined based on the operating frequency in order to achieve an optimum performance for that operating frequency.

Due to the performance variations within individual integrated circuits, the system design must take into account the worst case scenario for the integrated circuit in order to ensure correct operation of substantially all integrated circuits and components used within respective systems. Accordingly, in the case where a specific supply voltage is provided to the integrated circuit, the operating frequency will be based on the operating characteristics of a worst case integrated circuit. Alternatively, in the case where a specific operating frequency is required, the supply voltage is determined based on the operating characteristics of a worst case integrated circuit.

A problem with this situation is that the worst case scenario is only applicable to a small proportion of the integrated circuits used. As a result, for the majority of cases, the integrated circuits are operating at a frequency below that of which they are capable, and/or are being provided with a supply voltage greater than that which they require for correct operation. Accordingly, for the majority of cases, the performance and/or power consumption of the system is not optimised. Whilst this problem can be lessened by selecting and only using integrated circuits that have similar performance characteristics, and thus reducing the range of performance characteristics that need to be taken into consideration, the identification and selection of such integrated circuits introduces additional complications and cost/time implications into the fabrication/manufacturing processes. Furthermore, such a solution does not compensate for variations in the performance characteristics of an integrated circuit due to, for example, changes in environmental conditions, such as chip-internal supply voltage (changing due to IR drop phenomenon), temperature, the aging of components, etc. Accordingly, a margin of error must still be allowed for in order for, such variations to be tolerated. This impedes the optimisation of the performance and/or power consumption of the system.

A known method for overcoming these problems is to use performance detection circuitry, for example in the form of a ring-oscillator that is able to generate a signal based on, say, a detected timing performance. This signal may then be used to modify, for example, a voltage supply to ensure a sufficient supply voltage is provided to the integrated circuit in order for the integrated circuit to function correctly at a specific operating frequency. In this manner, a system may be configured for, say, normal case (or even best case) performance characteristics for the integrated circuit. As a result, a lower voltage supply may be used to achieve a required operating frequency than would be the case if the system were configured for worst case performance characteristics, thereby improving the power consumption of the system. However, if an integrated circuit used within the system comprises performance characteristics that are inferior to those for which the system has been configured, the performance detection circuitry will detect as such, and modify the supply voltage as required. Thus, for worst case integrated circuits, the voltage supply is modified such that these integrated circuits are able to function correctly at a specific operating frequency, whilst for normal or best case integrated circuits, improved performance/power consumption is achieved.

However, FIG. 1 illustrates an example of a timing diagram for this known technique of using such performance detection circuitry, demonstrating a problem therewith. A supply voltage is illustrated at 110, which is required to remain above a nominal value 112 in order of for the integrated circuit to function correctly at a specific operating frequency. Also illustrated is a clock signal 120 for the integrated circuit (and the performance detection circuitry). The supply voltage 110 is configured to be above the nominal value 112 during normal operating conditions by only a small amount in order to substantially optimise the power consumption of the system. As a consequence of this, the supply voltage 110 is susceptible to dropping below the nominal value 112 for intervals of time, for example due to a high load current causing a high voltage drop (IR-drop), as illustrated at 114. When the voltage supply 110 drops below the nominal value 112, the performance detection circuitry detects that the voltage supply 110 has dropped below that required for the integrated circuit to function correctly, and modifies the supply voltage 110 such that it rises back above the nominal value 112. However, as can be seen, there is a delay of a complete clock cycle 122 of the clock signal 120 between the supply voltage 110 dropping below the nominal value 112 and the performance detection circuit modifying the supply voltage 110 such that it rises back above the nominal value 112. As will be appreciated, this delay in correcting the supply voltage may result in critical paths within integrated circuit operating at a too slow rate to perform their functions correctly, and thus causing errors within the integrated circuit.

In order to overcome this problem of the delay in correcting the supply voltage, one known solution is to double-sample signals within the integrated circuit in order to detect 'late' arriving signals (for example see the Razor technique authored by: Ernst et al, "Razor: A Low-Power Pipeline Based on Circuit-Level Timing Speculation").

Upon detection of such 'late' arriving signals, all data sent within the current clock cycle is purged, and correct data is re-sampled. However, in order for such a solution to be effective, a large number of signals are required to be sampled, which for large and complex integrated circuits is not practical. Furthermore, such a solution would be problematic for non-pipeline type designs, where data processing paths are not serial and may have logic loops, and where stopping input data flow is not feasible.

It is also known within electronic systems for power management techniques to be implemented whereby the supply voltage and operating frequency for an integrated circuit are adjusted during operation, in order to improve power consumption or performance dependent upon the system requirements prevalent at that time. For example, during a period of low activity, the supply voltage and operating frequency may be reduced in order to reduce the power consumption of the device. When activity subsequently increases, the voltage supply and operating frequency may be increased in order to optimise the performance of the device. Whilst such power management techniques are generally able to improve the overall power-to-performance efficiency of a system, they still suffer from the same problem of having to take into account the worst case scenario for the integrated circuit in each configuration.

SUMMARY OF THE INVENTION

The present invention provides an integrated circuit and a method for generating a clock signal as described in the accompanying claims.

Specific examples of the invention are set forth in the dependent claims.

These and other aspects of the invention will be apparent from and elucidated with reference to the examples described hereinafter.

BRIEF DESCRIPTION OF THE DRAWINGS

Further details, aspects and examples of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Figure 1:
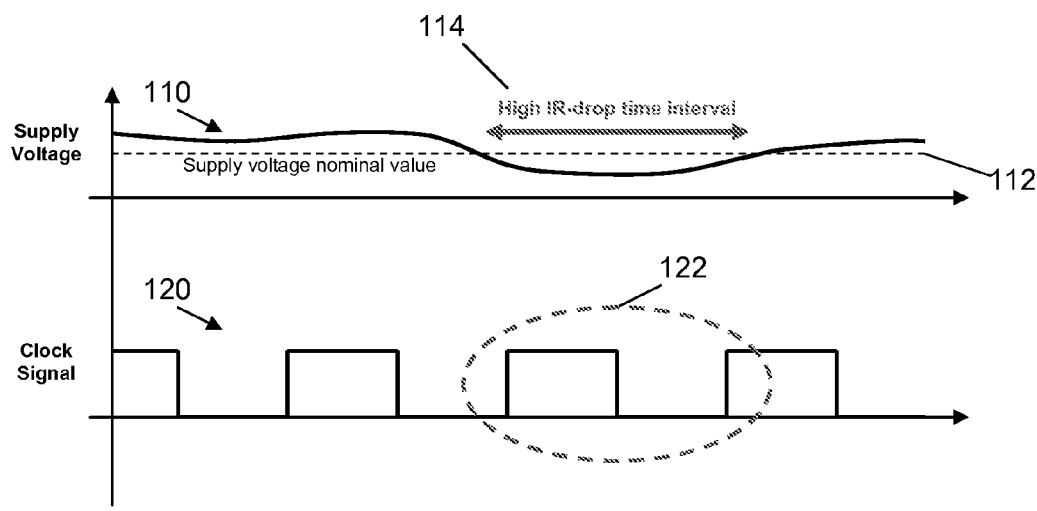
FIG. 1 illustrates an example of a timing diagram for a known performance detection circuitry.
Figure 2:
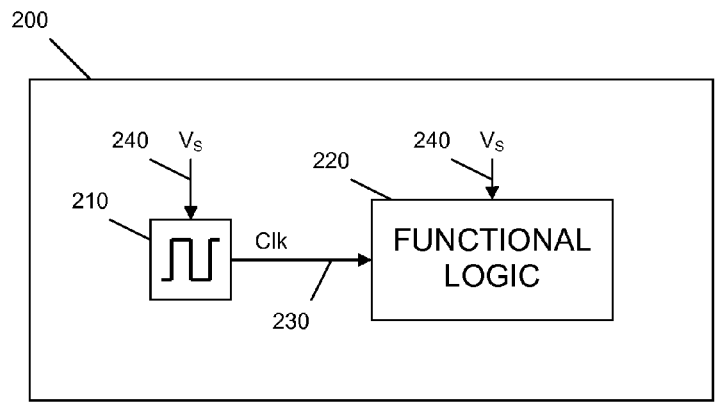
FIG. 2 illustrates an example of an integrated circuit adapted according to some embodiments of the present invention.

Referring to FIG. 2, there is illustrated an example of an integrated circuit 200. An integrated circuit typically comprises one or more semiconductor devices, and may also comprise passive components. The integrated circuit 200 comprises oscillator circuitry 210 arranged to generate a clock signal 230 for a functional logic module 220 of the integrated circuit 200. For the illustrated example, the oscillator circuitry 210 and the functional logic module 220 are operably coupled to a common supply voltage 240. The functional logic module 220 may comprise logic arranged to perform some function or task, or set of functions or tasks, associated with or required within the integrated circuit 100. Furthermore, the functional logic module 220 may be located on the same semiconductor device as the oscillator circuitry 210, or alternatively may be located on a different semiconductor device to that of the oscillator circuitry 210.

Figure 3:
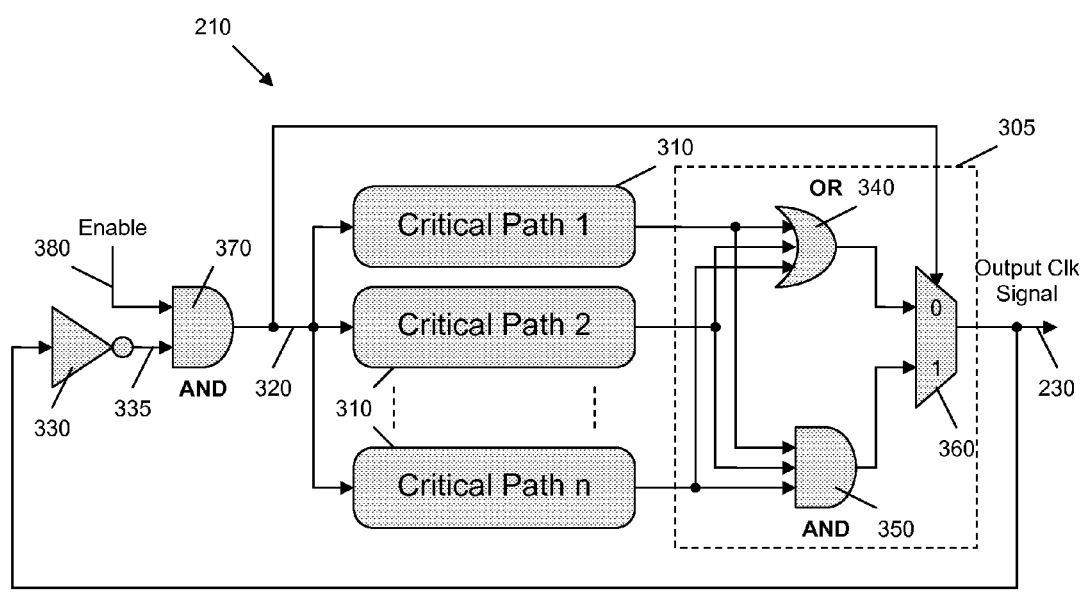
FIGS. 3 to 5 illustrate an example of oscillator circuitry implemented in the integrated circuit of FIG. 2.

Referring to FIG. 3, an example of the oscillator circuitry 210 of FIG. 2 is illustrated in greater detail. The oscillator circuitry 210 comprises a plurality of propagation paths 310, and is arranged to apply a transition signal 320 to inputs of the plurality of propagation paths 310. In this manner, transition signal 320 is propagated through each of the propagation paths 310. The oscillator circuitry 210 is further arranged to cause the output clock signal 230 to transition (for example from a '0' or 'low' value to a '1' or 'high value, or from a '1' or 'high' value to a '0' or 'low' value) based on a propagation of the transition signal 320 through the propagation paths 310. In particular for the illustrated example, the oscillator circuitry 210 comprises transition logic 305, operably coupled to outputs of the plurality of propagation paths 310 and arranged to cause the output clock signal 230 to transition upon the propagation of the transition signal 320 through the propagation paths 310 fulfilling a propagation criteria. For example, the transition logic 305 may be arranged to cause the output clock signal 230 to transition based on a worst case (e.g. a slowest) propagation of the transition signal 320 through the propagation paths 310.

In this manner, the transitions of the output clock signal 230, and thereby the operating frequency of the output clock signal 230, are based on the propagation of the transition signal 320 through the propagation paths 310, and in particular for the illustrated example based on a worst case propagation of the transition signal 320 through the propagation paths 310. Accordingly, the frequency of the output clock signal 230 is automatically adapted according to performance characteristics of cells (not shown) within the propagation paths 310, which provide a reference for the performance characteristics of other cells within the integrated circuit 200, and in particular for the performance characteristics of cells within the functional logic module 220.

In accordance with some examples, the propagation paths 310 may be arranged to be representative of critical paths (not shown) within the functional logic module 220 (for example those paths that are most likely to be the first to fail in case of too low a supply voltage or too high an operating frequency). In this manner, since cells within the propagation paths 310 comprise substantially the same performance characteristics to those of the functional logic module 220, the frequency of the output clock signal 230 may be arranged to ensure the frequency of the output clock signal 230 does not exceed that at which the critical paths within the functional logic module 220 will fail, irrespective of the performance characteristics for cells within the integrated circuit 200.

Whilst a particular path within the function logic module 220 may be the first to fail in case of too low a supply voltage or too high an operating frequency under one set of circumstances (e.g. one supply voltage level), it may not be the first to fail under a different set of circumstances (e.g. a different supply voltage level). Accordingly, identifying a single critical path, or a set of critical path characteristics, can be complicated, especially in large integrated circuit designs, and/or when operating conditions are constantly changing. However, by utilising a plurality of propagation paths 310, and causing the output clock signal 230 to transition based on a propagation of the transition signal 320 through the propagation paths 310, for example based on a worst case propagation of the transition signal 320 through the propagation paths 310, a plurality of critical paths and operating conditions may be taken into consideration, with, say, the worst case propagation at any one time being used to generate the output clock signal 230.

As previously mentioned with reference to FIG. 2, the oscillator circuitry 210 and the functional logic module 220 may be operably coupled to a common supply voltage 240. In this manner, the supply voltage 240 will affect the transition speed of cells within the propagation paths 310 in the same manner as for cells within the functional logic module 220. Furthermore, the propagation of the transition signal 320 through the propagation paths 310 will be affected by the supply voltage 240. Thus, by operably coupling the oscillator circuitry 210 and functional logic module 220 to a common supply voltage 240, the frequency of the output clock signal 230 may be further automatically adapted (by virtue of the affect of changes to the supply voltage on the cells within the propagation paths 310) to take into account changes within the supply voltage 240 affecting the performance and operating speeds of cells within the functional logic module 220. In particular, the oscillator circuitry 210 is able to thereby dynamically adapt the frequency of the output clock signal 230 to take into account variations within the supply voltage 240 to the functional logic module 220.

Referring back to FIG. 3, for the illustrated example, the oscillator circuitry 210 comprises inverter logic 330, an input of which is operably coupled to the output clock signal 230, and an output of which is operably coupled to the inputs of the propagation paths 310. In this manner, the oscillator circuitry 210 is arranged to apply a transition signal 320 comprising an inverse of the output clock signal 335 to inputs of the propagation paths 310, thereby causing the oscillation of the output clock signal 230. The oscillator circuitry 210 further comprises AND logic 370 arranged to receive as an input the inverse of the output clock signal 335, and to output the transition signal 320 to the propagation paths 310. The AND logic 370 is further arranged to receive, as an input, an oscillator circuitry enable signal 380. The oscillator circuitry 210 may be disabled by applying a '0' or 'low' value to the oscillator circuitry enable signal 380, the effect of which is to hold the transition signal 320 at a '0' or 'low' value, thereby preventing the oscillator circuit 210 from oscillating. In this manner, the output clock signal 230 may be stopped, substantially freezing the functional logic module 220. Conversely, when the oscillator circuit 210 is required to generate an oscillating output clock signal 230, the oscillator circuitry enable signal 380 is set to a '1' or 'high' value.

The transition logic 305 of the illustrated example may comprise OR logic 340 and AND logic 350. Outputs of the plurality of propagation paths 310 may be operably coupled to inputs of the OR logic 340 and the AND logic 350. The transition logic 305 may further comprise multiplexer logic 360, with outputs of the OR logic 340 and the AND logic 350 being operably coupled to inputs of the multiplexer logic 360. An output of the multiplexer logic 360 is arranged to provide the output clock signal 230. The multiplexer logic 360 is arranged, upon the transition signal 320 comprising a transition from a '0' or 'low' value to a '1' or 'high' value, to output a signal from the AND logic 350. Upon the transition signal 330 comprising a transition form a '1' or 'high' value to a '0' or 'low' value, the multiplexer logic 360 outputs a signal from the OR logic 340. In this manner, transitions output by the multiplexer logic 360 are based on a worst case propagation of the transition signal 320 through the propagation paths 310. In particular, for the illustrated example, the multiplexer logic 360 may be arranged to receive as a control signal the transition signal 320, and to output a signal from either the AND logic 350 or the OR logic 340, depending upon the transition signal 320.

Figure 4:
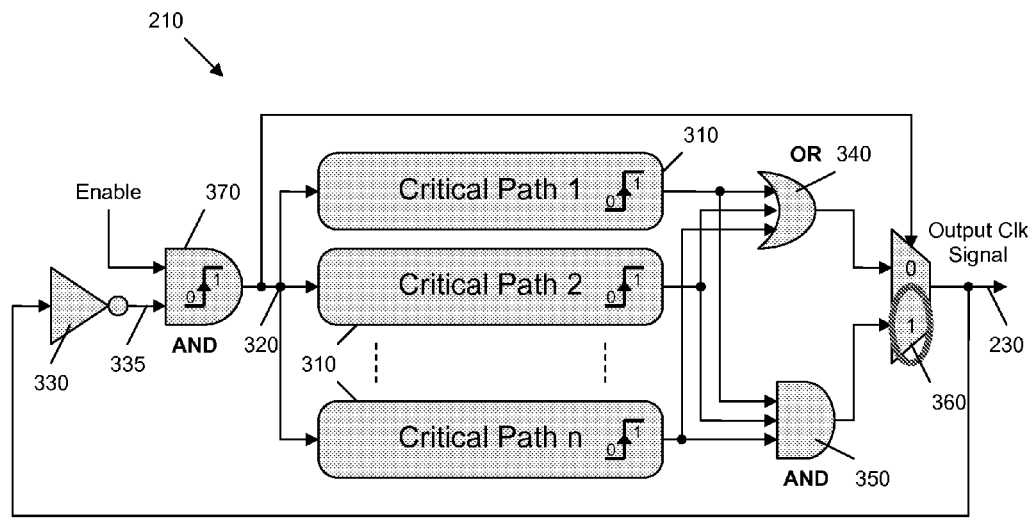

FIG. 4 illustrates an example of the oscillator circuitry 210 of FIG. 3, as applied during a transition from a '0' value to a '1' value of the output clock signal 230. For the illustrated example, the process of transitioning the output clock signal 230 from a '0' value to a '1' value commences substantially as soon as the output clock signal 230 transitions from a '1' value to a '0' value. The '0' value of the output clock signal 230 is inverted to a '1' value by inverter logic 330. This '1' value is then provided to the inputs of the plurality of propagation paths 310, via AND logic 370, in the form of transition signal 320. The '1' value is also provided to multiplexer logic 360 as a control signal. As previously mentioned, the multiplexer logic 360 may be arranged, upon the transition signal 320 comprising a transition from a '0' value to a '1' value as is the case for FIG. 4, to output a signal from the AND logic 350.

Notably, the transition from '0' to '1' of the transition signal 320 reaches the multiplexer logic 360 prior to the transition propagating through any one of the propagation paths 310. As a result, when the multiplexer switches from outputting a signal from the OR logic 340 to outputting a signal from the AND logic 350, both the OR logic 340 and the AND logic 350 are outputting a '0' value, since all of the propagation paths 310 still output a '0' value (the transition from '0' to '1' having yet to propagate through any of them). Consequently, such a value switch from outputting a signal from the OR logic 340 to outputting a signal from the AND logic 350 does not affect the output clock signal 230.

As will be appreciated, the AND logic 350 will output a '0' value until the transition from a '0' value to a '1' value has propagated through all of the propagation paths 310, and only once each propagation path 310 outputs a '1' value will the AND logic 350 output a '1' value. Accordingly, by arranging the multiplexer logic 360 to output a signal from the AND logic 350 when transitioning from a '0' value to a '1' value, the output clock signal 230 will only transition from a '0' value to a '1' value upon completion of the worst case propagation of the transition through the propagation paths 310. Thus, the duration between output clock signal transitions is dependent on the time taken for the transition signal to propagate through the worst case, or 'slowest', of the propagation paths 310.

Figure 5:
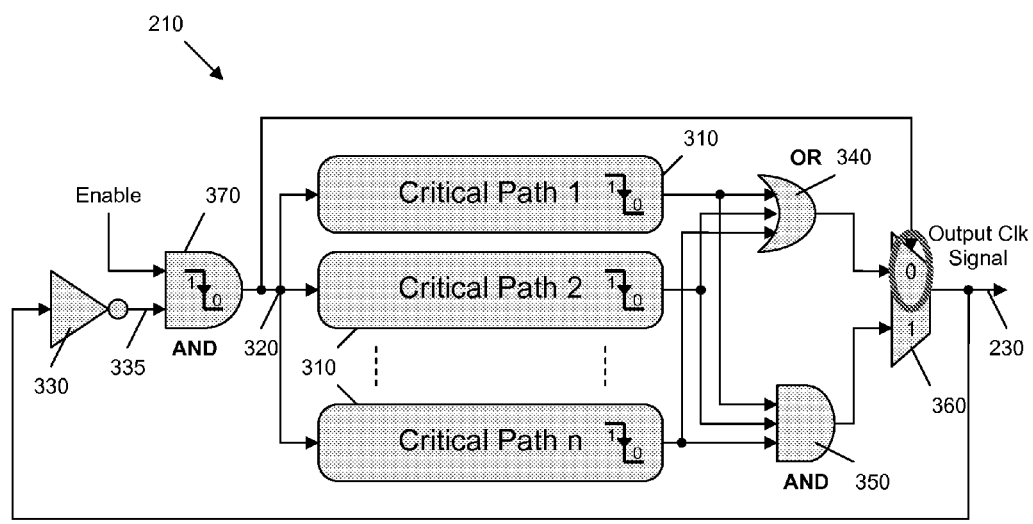

Referring now to FIG. 5 there is illustrated an example of the oscillator circuitry 210 of FIG. 3 as applied during a transition from a '1' value to a '0' value of the output clock signal 230. Once again for the illustrated example, the process of transitioning the output clock signal 230 from a '1' value to a '0' value commences substantially as soon as the output clock signal 230 transitions from a logical '0' value to a logical '1' value. The logical '1' value of the output clock signal 230 is inverted to a logical '0' value by inverter logic 330. This '0' value is then provided to the inputs of the plurality of propagation paths 310, via AND logic 370, in the form of transition signal 320. The '0' value is also provided to multiplexer logic 360 as a control signal. As previously mentioned, the multiplexer logic 360 may be arranged, upon the transition signal 320 comprising a transition from a '1' value to a '0' value as is the case for FIG. 5, to output a signal from the OR logic 350.

Once again, the transition from '1' to '0' of the transition signal 320 reaches the multiplexer logic 360 prior to the transition propagating through any one of the propagation paths 310. As a result, when the multiplexer switches from outputting a signal from the AND logic 350, to outputting a signal from the OR logic 340, both the OR logic 340 and the AND logic 350 are outputting a '1' value, since all of the propagation paths 310 still output a '1' value (the transition from '1' to '0' having yet to propagate through any of them). Consequently, such a value switch from outputting a signal from the AND logic 350 to outputting a signal from the OR logic 340 does not affect the output clock signal 230.

As will be appreciated, the OR logic 340 will output a '1' value until the transition from a '1' value to a '0' value has propagated through all of the propagation paths 310, and only once each propagation path 310 outputs a '0' value will the OR logic 340 output a '0' value. Accordingly, by arranging the multiplexer logic 360 to output a signal from the OR logic 340 when transitioning from a '1' value to a '0' value, the output clock signal 230 will only transition from a '1' value to a '0' value upon completion of the worst case propagation of the transition through the propagation paths 310.

In this manner, the propagation paths 310 provide a means of controlling the output clock signal transitions, and thereby the rate at which the output clock signal 230 oscillates. Thus, and as mentioned before, the transitions of the output clock signal 230, and thereby the operating frequency of the output clock signal 230, are based on the worst case propagation of the transition signal 320 through the propagation paths 310. Accordingly, the frequency of the output clock signal 230 is automatically adapted according to performance characteristics of cells (not shown) within the propagation paths 310, which provide a reference for the performance characteristics of other cells within the integrated circuit 200, and in particular for the performance characteristics of cells within the functional logic module 220.

Figure 6:
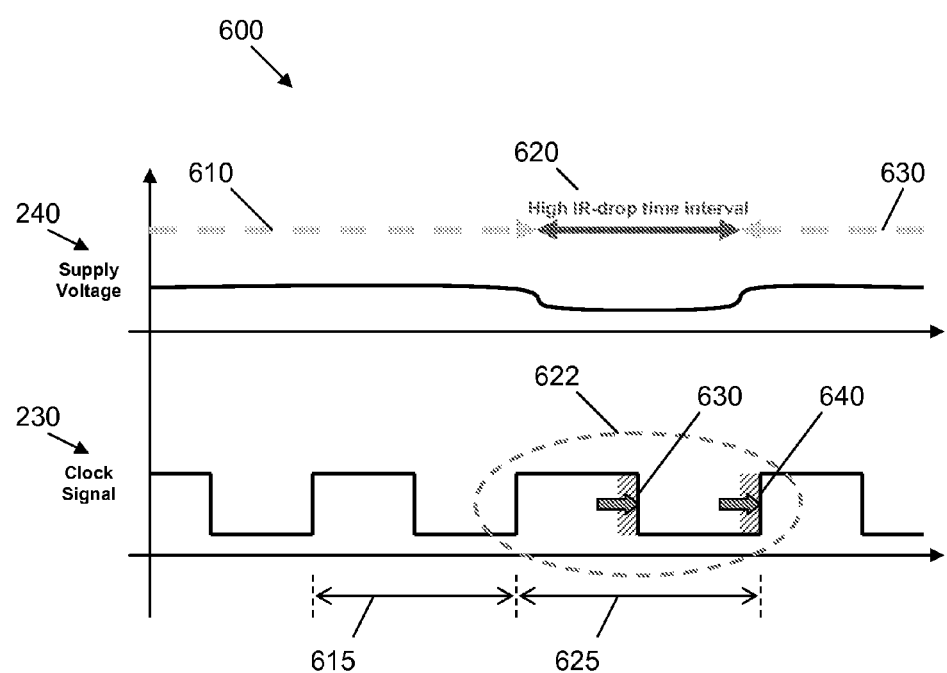
FIG. 6 illustrates an example of a simplified timing diagram for the oscillator circuitry of FIG. 2.

Referring now to FIG. 6, there is illustrated an example of a simplified timing diagram 600 for the oscillator circuitry 210 of FIG. 2, showing the supply voltage 240 and output clock signal 230. As can be seen, the supply voltage 240 initially comprises a substantially stable voltage level 610. As will be appreciated, the voltage level of the supply voltage 240 affects the speed at which a transition propagates through cells within the propagation paths 310 of the oscillator circuitry 210, as well as within the functional logic module 220. Accordingly, the rate at which the output clock signal 230 oscillates, and thereby its frequency of operation, is dependent upon the voltage value of the supply voltage 240.

Accordingly, whilst the supply voltage initially comprises a substantially stable voltage level 610, the output clock signal 230 comprises a substantially stable clock cycle, as illustrated at 615.

The supply voltage 240 may be susceptible to changes in its voltage value, for example a drop in voltage in certain intervals of time, due to, say, a high load current causing a high IR-drop, as illustrated at 620. Such a drop in the supply voltage 240 will automatically cause the rate at which transitions propagate through the cells within the propagation paths 310 to decrease, and as a result will automatically cause the rate at which the output clock signal 230 oscillates to slow, thereby automatically reducing the frequency of the output clock signal 230. Thus, as illustrated in FIG. 6, when the supply voltage 240 drops, transitions 630 and 640 are automatically delayed relative to their respective predecessors, resulting in a longer clock cycle 625. In particular, the reduction in the rate at which transitions propagate through cells within the propagation paths 310 may be configured to be substantially equivalent to the reduction in the rate at which transitions propagate through critical paths within the functional logic module 220. As a result, the oscillator circuitry 120 may be arranged to automatically adjust the frequency of the output clock signal 230 in response to variations in the supply voltage 240, such that the functional logic module 220 continues to function correctly. Furthermore, the frequency of the output clock signal 230 is adjusted substantially immediately, within the first clock cycle 622 following the drop in supply voltage, thereby substantially alleviating the problem of a delayed response that is present within the prior art techniques.

Additionally, in the case where the drop in the supply voltage is caused by a high load current causing a high IR-drop, the reduction in the frequency of the output clock signal 230 provides negative feedback to the consumed current causing the IR-drop. As a consequence, the sudden high-IR drop is reduced, thereby aiding the return of the supply voltage 240 to its initial voltage level.

As also illustrated, upon the supply voltage 240 increasing, for example back to its initial voltage level as illustrated at 630, the increase in supply voltage causes the rate at which transitions propagate through the cells within the propagation paths 310 to increase. As a result, this effect will automatically cause the rate at which the output clock signal 230 oscillates to speed up, thereby automatically increasing the frequency of the output clock signal 230. Thus, transitions of the output clock signal 230 are automatically advanced relative to their respective predecessors when the supply voltage 240 increases, thereby resulting in a shorter clock cycle and a higher frequency. In this manner, the performance of the functional logic module 220 is immediately increased following an increase in supply voltage.

Figure 7:
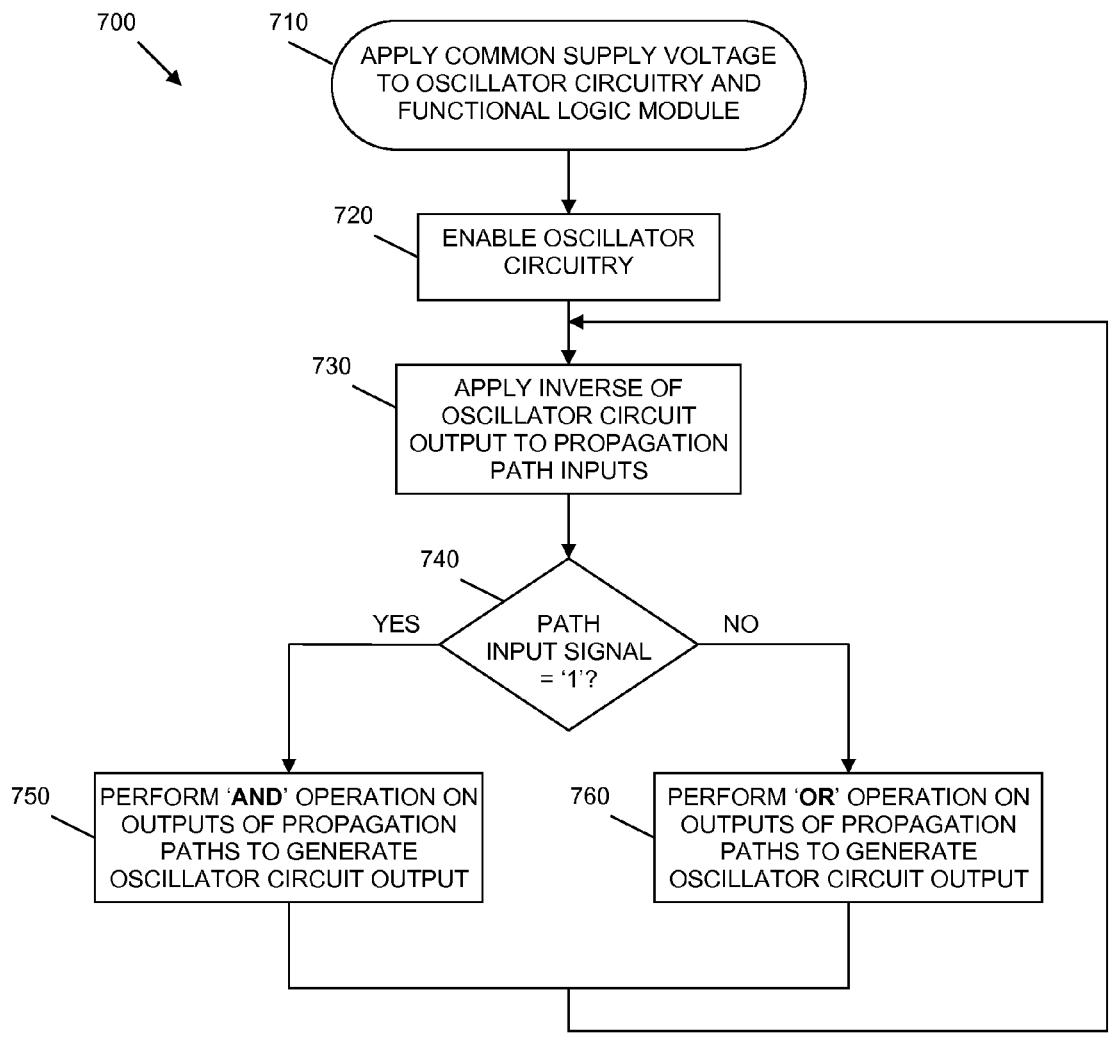
FIG. 7 illustrates an example of a simplified flowchart of a method for generating a clock signal.

Referring now to FIG. 7, there is illustrated an example of a simplified flowchart 700 of a method for generating a clock signal for a functional logic module within an integrated circuit. For the illustrated example, the method starts at step 710 with the application of a common voltage supply to both oscillator circuitry and the functional logic module. Next, in step 720, the oscillator circuitry is enabled. The method then moves on to step 730, where a transition signal, which for the illustrated example is in the form of an inverse of the output of the oscillator circuit, is applied to inputs of a plurality of propagation paths within the oscillator circuitry. Next, in step 740, it is determined whether the transition signal comprises a '1' value or a '0' value. If the transition signal comprises a '1' value, the method moves on to step 750, and an AND operation is performed on outputs of the propagation paths to generate an output clock signal. The method then loops back to step 730. Conversely, if the transition signal comprises a '0' value, the method moves on to step 760, and an OR operation is performed on output of the propagation paths to generate an output clock signal. The method then loops back to step 730.

Figure 8:
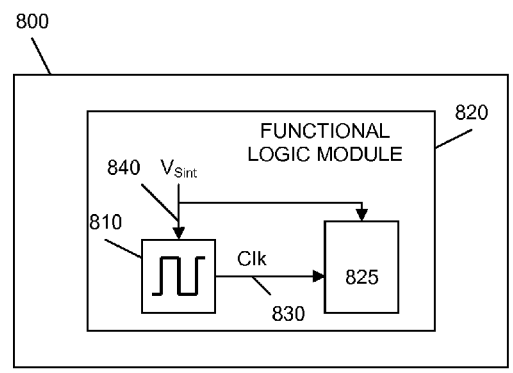
FIG. 8 and FIG. 9 illustrate further examples of an integrated circuit.

Referring now to FIG. 8, there is illustrated an alternative example of an integrated circuit 800. The integrated circuit 800 comprises oscillator circuitry 810 arranged to generate a clock signal 830 for functional logic 825 within a functional logic module 820 of the integrated circuit 800. In particular, for the example illustrated in FIG. 8, oscillator circuitry 810 is located within the function logic module 820, and arranged to be operably coupled to an internal supply voltage 840 ($V_{Sint}$) of the function logic module 820. In this manner, the oscillator circuitry 810 is subjected to substantially the same fluctuations in supply voltage as the function logic 825 of the functional logic module 820.

The oscillator circuitry 210 of the examples hereinbefore described has been arranged to cause the output clock signal 230 to transition based on a propagation of the transition signal 320 through a determined set of the propagation paths 310, wherein the determined set of propagation paths 310 comprises substantially all of the propagation paths 310. However, it is contemplated that the oscillator circuitry 210 may be arranged such that one or more of the propagation paths 310 may be selectively masked.

Figure 9:
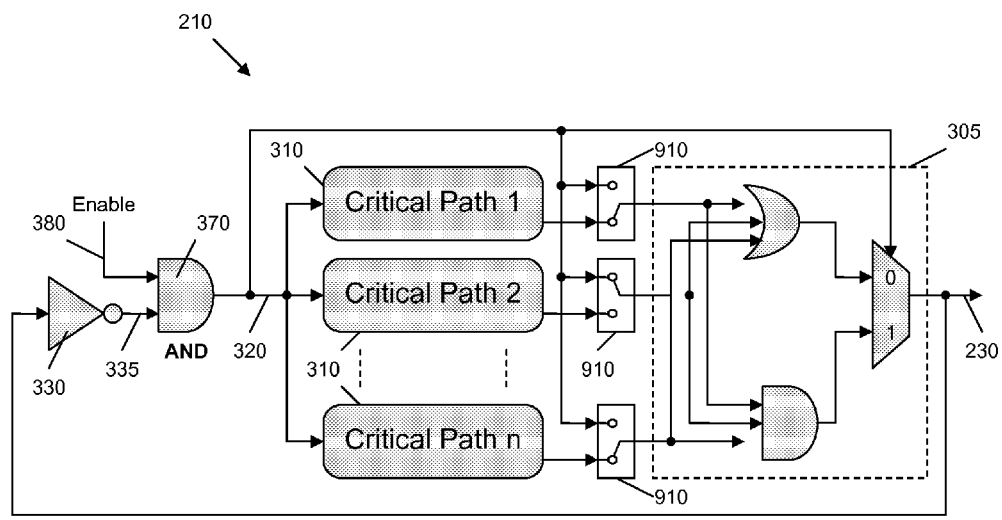

FIG. 9 illustrates such a further example of oscillator circuitry 210. For the example illustrated in FIG. 9, the output of each propagation path 310 is operably coupled to the transition logic 305 via a switching element 910, each switching element 910 being arranged to selectively mask its respective propagation path. Each switching element 910 is further operably coupled to the transition signal 320 and arranged to selectively couple either the output of the respective propagation path 310 or the transition signal 320 to the transition logic 305. In this manner, the propagation paths 310 may be individually masked by selectively configuring the switching elements 910 for those propagation paths 310 to be masked, in order to couple the transition signal 320 to the transition logic 305. Accordingly, the determined set of propagation paths 310, upon which the transitioning of the output clock signal 320 is based, may be configurable. For example, where a propagation path 310 represents a specific part of the functional logic module 220, if that part of the functional logic module 220 is not being used, that propagation path 310 may be masked. Although for the example illustrated in FIG. 9, the output of all illustrated propagation paths 310 are operably coupled to the transition logic 305 via a switching element 910, it is contemplated that the outputs of only a sub-set of the propagation paths 310 may be operably coupled to the transition logic 305 via a switching element 910.

In one example, the propagation paths 310 may comprise any suitable arrangement of cells. For example, a propagation path 310 may comprise a replica of a critical path within the function logic module 220, such as a critical path comprising a path likely to be one of the first to fail in case of undervoltage or over-frequency, and thereby limiting the performance of the functional logic module 220. As such, the propagation path may be arranged to comprise the same combination and sequence of cells that make up the identified critical path within the functional logic module 220.

Alternatively, in one example, a propagation path 310 may comprise a statistical-based cell group for a critical path within the function logic module 220. For example, the propagation path 310 may be arranged to comprise cells configured into an arrangement comprising an equivalent fan out as the critical path within the function logic module, for example comprising the same number of cells, equivalent sizes and types of cells, etc.

Alternatively still, in a further example, a propagation path 310 may comprise a defined cell type, whereby the propagation path 310 comprises a sequence of a particular type of cell (e.g. a sequence of hVt (high voltage threshold) cells, or a sequence of sVt (standard voltage threshold) cells, etc.). In this manner, a plurality of propagation paths 310 may be used, each propagation path 310 comprising a different type of cell. Thus, the affect of voltage variations on different types of cells may be taken into consideration when generating the output clock signal.

Another example may comprise a propagation path 310 comprising a defined cell size. In the same manner as for a propagation path comprising a defined cell type, the propagation path may comprise a sequence of a particular size of cell.

The propagation paths 310 are not limited to these particular examples, but may comprise any other suitable configuration of cells, including any suitable combination of the above examples.

As previously mentioned, the oscillator circuitry 210 of the illustrated example may be arranged such that the transitions of the output clock signal 230, and thereby the operating frequency of the output clock signal 230, are based on a worst case propagation of the transition signal 320 through the propagation paths 310. Accordingly, the frequency of the output clock signal 230 is automatically adapted according to performance characteristics of cells (not shown) within the propagation paths 310, which provide a reference for the performance characteristics of other cells within the integrated circuit 200, and in particular for the performance characteristics of cells within the functional logic module 220. Accordingly, calibration of the oscillator circuitry is not required to take into account significant variations in the performance characteristics of different integrated circuits to the same extent as for prior art clock generation solutions. Consequently, the oscillator circuitry 210 is able to be configured to generate clock signals significantly closer to the operating limits of the functional logic module 220. As a result, the functional logic module 220 may be provided with a lower supply voltage for a required operating frequency, thereby improving power consumption. Alternatively or additionally the functional logic module 220 may be provided with a higher clock frequency for a particular supply voltage, thereby improving performance. In particular, integrated circuits comprising normal case or best case performance characteristics are not limited to operating within the restricted parameters required for worst case performance characteristics.

In addition, the oscillator circuitry of the illustrated example may be further capable of compensating for variations in the performance characteristics of the integrated circuit due to, for example, changes in environmental conditions, such as temperature, the ageing of components, etc. Accordingly, a margin of error may be substantially reduced in the clock signal frequency, as compared with prior art techniques, in order for such variations to be tolerated, thereby enabling greater optimisation of the performance and/or power consumption of the system. Thus, the exemplary method and apparatus herein described may enable the automatic generation of a more optimum (slower) clock frequency for a target functional logic module depending upon current operating conditions, such as, by way of example, supply voltage, temperature, performance characteristics, etc.

It is contemplated that the margin of error may be provided by way of a shorted propagation path. Alternatively, the margin or error may be provided by reducing the supply voltage provided to the propagation paths to 'slow' the propagation of the transition signal through them.

Furthermore and as previously mentioned, the oscillator circuitry of the illustrated example may be capable of compensating for variations in supply voltage substantially immediately, thereby substantially alleviating the problem of such compensation being delayed as suffered by prior art techniques. In addition, whilst examples of such voltage supply variations have been described herein in terms of, for example, high load current causing a high IR-drop, variations in supply voltage may equally be due to power management techniques. Accordingly, the oscillator circuitry of the illustrated example may be capable of automatically adjusting the frequency of the output clock signal to take into account intentional voltage changes, for example for the purpose of improving performance or power consumption of the system as required.

Further advantageous aspects of an asynchronous clock source, such as the oscillator circuitry 210 of FIG. 2 over a standard PLL (Phase Locked Loop), include a decrease in power consumption, silicon area and clock start (clock start delay also known as "PLL lock period") due to substantially no delay from enable to clock signal generation.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate examples, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different examples may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Although the invention has been described with respect to specific conductivity types or polarity of potentials, skilled artisans appreciated that conductivity types and polarities of potentials may be reversed.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit comprising:
   oscillator circuitry arranged to generate a clock signal for a functional logic module of the integrated circuit, wherein
   the clock signal comprises an output clock signal,
   the oscillator circuitry comprises a plurality of propagation paths, OR logic, AND logic and multiplexer logic, wherein outputs of the plurality of propagation paths are operably coupled to both of inputs of the OR logic and inputs of the AND logic,
   outputs of the OR logic and the AND logic are operably coupled to inputs of the multiplexer logic, and
   an output of the multiplexer logic being arranged to provide the output clock signal, and
   the oscillator circuitry is further configured to
   apply a transition signal to inputs of the plurality of propagation paths, said multiplexer logic arranged to receive as a control signal, the transition signal, and
   cause the output clock signal to transition based on a propagation of the transition signal through a determined set of the propagation paths.

2. The integrated circuit of claim 1, wherein the oscillator circuitry comprises:
   transition logic comprises the OR logic, the AND logic, and the multiplexer logic, operably coupled to the outputs of the plurality of propagation paths, wherein
   the transition logic is arranged to cause the output clock signal to transition upon the propagation of the transition signal through the determined set of propagation paths fulfilling a propagation criteria.

3. The integrated circuit of claim 2, wherein the transition logic is further arranged to cause the output clock signal to transition from a logic "0" value to a logic "1" value based on a worst case propagation of the transition signal through the determined set of propagation paths and to transition from the logic "1" value to the logic "0" value based on the worst case propagation of the transition signal through the determined set of propagation paths.

4. The integrated circuit of claim 2, further comprising:
   one or more switching elements, wherein
   the output of one or more of the propagation paths is operably coupled to the transition logic via the one or more switching elements, and
   each switching element is arranged to selectively mask its respective propagation path.

5. The integrated circuit of claim 2, wherein the multiplexer logic is arranged, in response to the transition signal comprising a transition from a "0" value to a "1" value, to output a signal from either the AND logic or the OR logic.

6. The integrated circuit of claim 1, wherein the oscillator circuitry and the functional logic module are operably coupled to a common supply voltage.

7. The integrated circuit of claim 1, wherein the functional logic module comprises the oscillator circuitry, an internal supply voltage, and functional logic, a common supply voltage comprises the internal supply voltage, the output clock signal is operably coupled to the functional logic, and the oscillator circuitry is operably coupled to the internal supply voltage of the functional logic module.

8. The integrated circuit of claim 1, wherein the multiplexer logic is arranged, in response to the transition signal comprising a transition from a "0" value to a "1" value, to output a signal from either the AND logic or the OR logic.

9. The integrated circuit of claim 1, wherein the oscillator circuitry is arranged to apply the transition signal comprising an inverse of the output clock signal to the inputs of the plurality of propagation paths.

10. The integrated circuit of claim 9, wherein the oscillator circuitry further comprises a second AND logic arranged to receive as an input the inverse of the output clock signal, and to output the transition signal.

11. The integrated circuit of claim 10, wherein the second AND logic is further arranged to receive as an input an oscillator circuitry enable signal.

12. The integrated circuit of claim 1, wherein at least one of the propagation paths comprises at least one from a group of:
 a replica of a critical path within the functional logic module;
 a statistical-based cell group for a critical path within the functional logic module;
 a defined cell type path; and
 a defined cell size path.

13. A method for generating a clock signal for a functional logic module within an integrated circuit comprising oscillator circuitry, the method comprising:
 generating the clock signal by the oscillator circuitry including a plurality of propagation paths, and a multiplexer logic, wherein
  the clock signal comprises an output clock signal, and
  an output of the multiplexer logic being arranged to provide the output clock signal; and
 applying a transition signal to inputs of the plurality of propagation paths, wherein the multiplexer logic is arranged to receive as a control signal, the transition signal;
 performing an AND operation and an OR operation on outputs of the plurality of propagation paths, in response to the transition signal;
 multiplexing the results of said performing the AND operation and the OR operation to generate the output clock signal, in response to the transition signal; and
 causing the output clock signal of the oscillator circuitry to transition based on a propagation of the transition signal through at least one of the propagation paths.

14. The method of claim 13, further comprising: causing the output clock signal to transition upon propagation of the transition signal through the at least one of the propagation paths, wherein the transition fulfills a propagation criteria.

15. The method of claim 14, further comprising:
 causing the output clock signal to transition based on a worst case propagation of the transition signal through the at least one of the propagation paths.

16. The method of claim 13, wherein said performing the AND operation and the OR operation further comprises:
 performing the AND operation in response to the transition signal comprising a value; and
 performing the OR operation in response to the transition signal comprising a value, wherein
  the transition signal comprises an inverse of the output clock signal.

17. An integrated circuit comprising:
 oscillator circuitry arranged to generate a clock signal for a functional logic module of the integrated circuit, wherein
  the clock signal comprises an output clock signal,
  the oscillator circuitry comprises a plurality of propagation paths and a multiplexer logic, wherein
   an output of the multiplexer logic being arranged to provide the output clock signal, and
  the oscillator circuitry is further configured to
   apply a transition signal to inputs of the plurality of propagation paths, said multiplexer logic arranged to receive as a control signal, the transition signal,
   wherein the transition signal comprising an inverse of the output clock signal, and
   cause the output clock signal to transition based on a propagation of the transition signal through a determined set of the propagation paths.

18. The integrated circuit of claim 17, wherein the oscillator circuitry comprises:
 transition logic operably coupled to outputs of the plurality of propagation paths, wherein the transition logic is arranged to cause the output clock signal to transition upon the propagation of the transition signal through the determined set of propagation paths fulfilling a propagation criteria.

19. The integrated circuit of claim 17,
 wherein at least one of the propagation paths comprises at least one from a group of:
 a replica of a critical path within the functional logic module;
 a statistical-based cell group for a critical path within the functional logic module; a defined cell type path; and a defined cell size path.

20. A method for generating a clock signal for a functional logic module within an integrated circuit comprising oscillator circuitry, the method comprising:
 generating a clock signal by the oscillator circuitry including a plurality of propagation paths, and a multiplexer logic, wherein
  the clock signal comprises an output clock signal, and
  an output of the multiplexer logic being arranged to provide the output clock signal;
 applying a transition signal to inputs of the plurality of propagation paths, wherein
  the multiplexer logic is arranged to receive as a control signal, the transition signal, wherein
   the transition signal comprising an inverse of the output clock signal; and
 causing the output clock signal of the oscillator circuitry to transition based on a propagation of the transition signal through at least one of the propagation paths.

* * * * *